(12) United States Patent
van Bezooijen et al.

(10) Patent No.: US 9,979,080 B2
(45) Date of Patent: May 22, 2018

(54) CALIBRATION AND ADAPTIVE CONTROL OF ANTENNA TUNERS

(71) Applicant: QUALCOMM Incorporated, San Diego, CA (US)

(72) Inventors: Adrianus van Bezooijen, Molenhoek (NL); Kevin Robert Boyle, Horsham (GB); Maurice Adrianus de Jongh, Nijmegen (NL); Robbin Damen, Nijmegen (NL); Erwin Spits, Utrecht (NL); David Loweth Winslow, Nijmegen (NL)

(73) Assignee: QUALCOMM Incorporated, San Diego, CA (US)

( * ) Notice: Subject to any disclaimer, the term of this patent is extended or adjusted under 35 U.S.C. 154(b) by 257 days.

(21) Appl. No.: 14/812,438

(22) Filed: Jul. 29, 2015

(65) Prior Publication Data

US 2017/0033454 A1    Feb. 2, 2017

(51) Int. Cl.
| | |
|---|---|
| *H01Q 1/50* | (2006.01) |
| *H01Q 9/06* | (2006.01) |
| *H04B 1/04* | (2006.01) |
| *H03H 7/40* | (2006.01) |
| *H04B 17/12* | (2015.01) |
| *H04B 1/18* | (2006.01) |
| *H04B 17/21* | (2015.01) |

(52) U.S. Cl.
CPC ............. *H01Q 1/50* (2013.01); *H01Q 9/06* (2013.01); *H03H 7/40* (2013.01); *H04B 1/0458* (2013.01); *H04B 17/12* (2015.01); *H04B 1/18* (2013.01); *H04B 17/21* (2015.01)

(58) Field of Classification Search
CPC .................................. H01Q 1/50; H01Q 9/06
USPC ......................................................... 343/745
See application file for complete search history.

(56) References Cited

U.S. PATENT DOCUMENTS

| | | | |
|---|---|---|---|
| 4,267,599 A | 5/1981 | Vissers | |
| 8,068,798 B2 | 11/2011 | Wilcox et al. | |
| 8,351,874 B2 | 1/2013 | Dent et al. | |
| 8,472,888 B2 | 6/2013 | Manssen et al. | |
| 8,774,743 B2 | 7/2014 | Ali et al. | |
| 8,787,864 B2 | 7/2014 | Leung et al. | |
| 2005/0087887 A1* | 4/2005 | Behzad | H01L 23/36 257/786 |
| 2009/0256644 A1* | 10/2009 | Knudsen | H04B 1/0458 333/32 |
| 2009/0264078 A1* | 10/2009 | Yun | H04B 17/16 455/67.11 |

(Continued)

OTHER PUBLICATIONS

Boyle, K.R. et al., "A Self-Contained Adaptive Antenna Tuner for Mobile Phones: Featuring a Self-Learning Calibration Procedure," IEEE 6th European Conference on Antennas and Propagation (EUCAP), Mar. 2012, pp. 1804-1808.

(Continued)

*Primary Examiner* — Andrea Lindgren Baltzel
(74) *Attorney, Agent, or Firm* — Qualcomm Incorporated—Toler (57) ABSTRACT

An apparatus includes a radio-frequency (RF) path that includes an antenna tuner. The apparatus also includes calibration circuitry coupled to the antenna tuner. The calibration circuitry is configured to selectively isolate an antenna from a component of the RF path.

20 Claims, 8 Drawing Sheets

(56) References Cited

U.S. PATENT DOCUMENTS

2013/0183910 A1  7/2013  Bavisi et al.
2013/0309980 A1  11/2013 Seth et al.

OTHER PUBLICATIONS

Gu, Qizheng et al., "An Analytical Algorithm for Pi-Network Impedance Tuners," IEEE Transactions on Circuits and Systems—I: Regular Papers, vol. 58, No. 12, Dec. 2011, pp. 2894-2905.
Kwan, Godfrey, "Sensitivity Analysis of One-Port Characterized Devices in Vector Network Analyzer Calibrations: Theory and Computational Analysis," NCSL International Workshop & Symposium, Agilent Technologies, 2002, 12 Pages.
Wiles, Martin et al., "Pre-Compliant and Affordable Over-The-Air Measurements on Wireless Devices," IEEE 6th European Conference on Antennas and Propagation, Mar. 2012, pp. 1561-1565.
International Search Report and Written Opinion—PCT/US2016/040831—ISA/EPO—dated Oct. 12, 2016.

* cited by examiner

CALIBRATION AND ADAPTIVE CONTROL OF ANTENNA TUNERS

I. FIELD

The present disclosure is generally related to electronics, and more specifically to antenna tuners.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities and may support increasing wireless communication capability in downlink communications that send information to the wireless telephones and in uplink communications that transmit information from the wireless telephones.

Wireless devices, such as wireless telephones, typically include antenna tuners that include one or more variable impedance elements and switching circuitry. Antenna tuners may be configured to perform impedance matching between a radio-frequency (RF) path, such as a transmit path or a receive path, and an antenna. Conventionally, such "tuners" are adjusted based on measurements from a wideband detector near the antenna tuner. However, placement of a wideband detector near the antenna tuner causes the wideband detector to also detect frequencies other than the frequency of a signal of interest. Antenna tuners may be characterized by performance of radiation measurements within an anechoic chamber to determine preferred tuner settings (e.g., which configuration of switches and/or configurable impedance elements in the antenna tuner) for a particular antenna over a limited number of use cases. After characterization, the selected tuner settings can be used by an adaptive tuning algorithm that attempts to select the most appropriate tuner settings for a particular frequency and particular conditions based on measurements made by the wideband detector during a wireless communication session. Such adaptive tuning algorithms may have a slow convergence to select a tuner setting or may fail to converge. Also, performing an adaptive tuning algorithm during RF communications may cause the RF communications to be adversely impacted if the adaptive tuning algorithm selects an inappropriate tuner setting to be used during the searching algorithm.

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
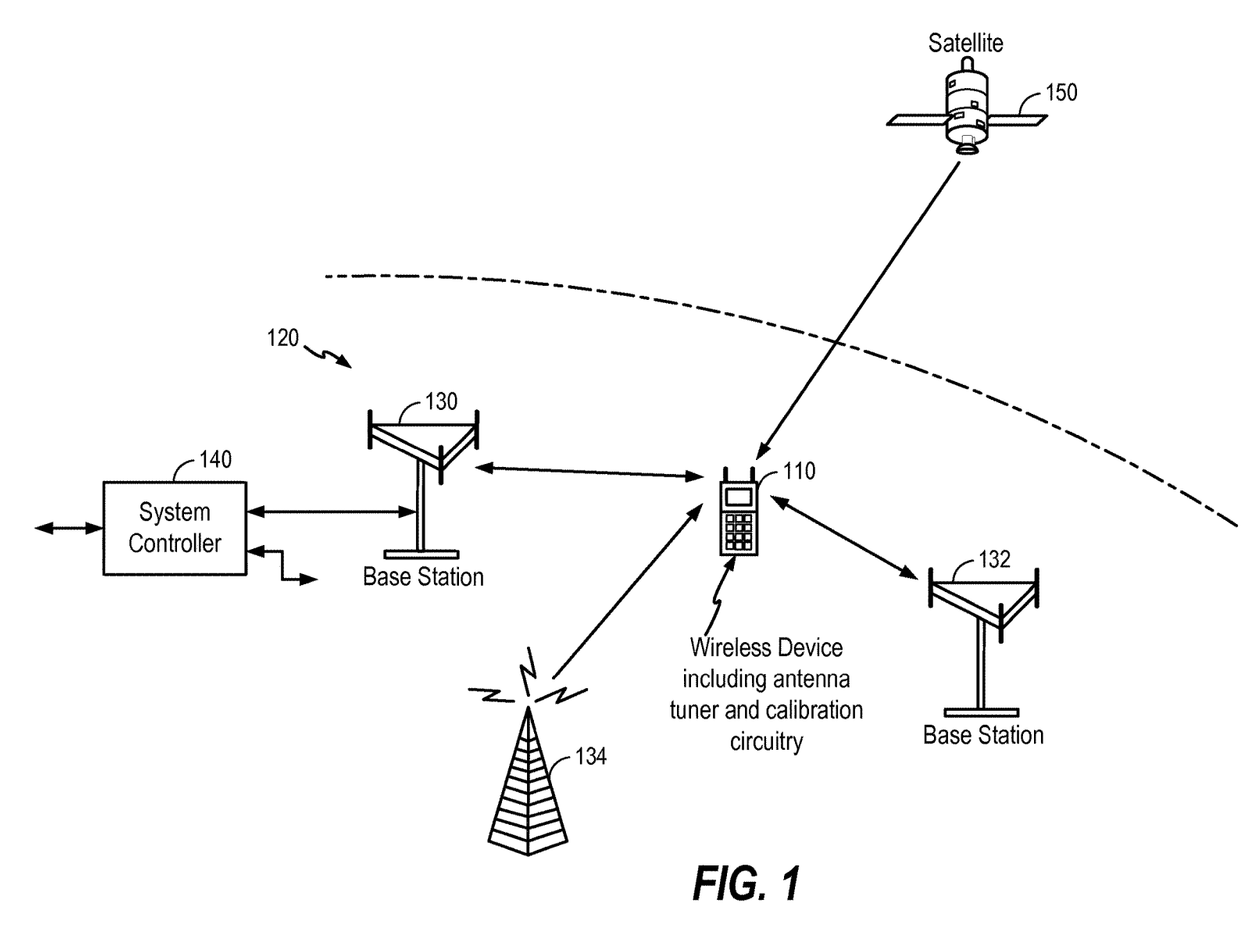
FIG. 1 shows a wireless device that includes an antenna tuner and calibration circuitry, the wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Furthermore, in an exemplary embodiment, the wireless device 110 may include a RF path (e.g., a transmission path) that includes an antenna tuner. The wireless device 110 may also include calibration circuitry coupled to the antenna tuner. The antenna tuner may include one or more variable impedance elements that are configurable to perform impedance matching with an impedance of an antenna of the wireless device 110. The calibration circuitry is configured to selectively isolate the antenna from a component of the RF path during a calibration operation of the wireless device 110. The calibration operation characterizes at least a portion of the RF path by performing measurements at the RF path while one or more selected calibration impedances are coupled as terminal loads to the RF path. Characterizing the RF path while the antenna is isolated enables the wireless device 110 to determine antenna impedance with enhanced accuracy as compared to wireless devices that estimate antenna impedance without characterizing the RF path. Accurately determining antenna impedance enables determining of an appropriate antenna tuner configuration for accurate impedance matching to the antenna impedance.

Figure 2:
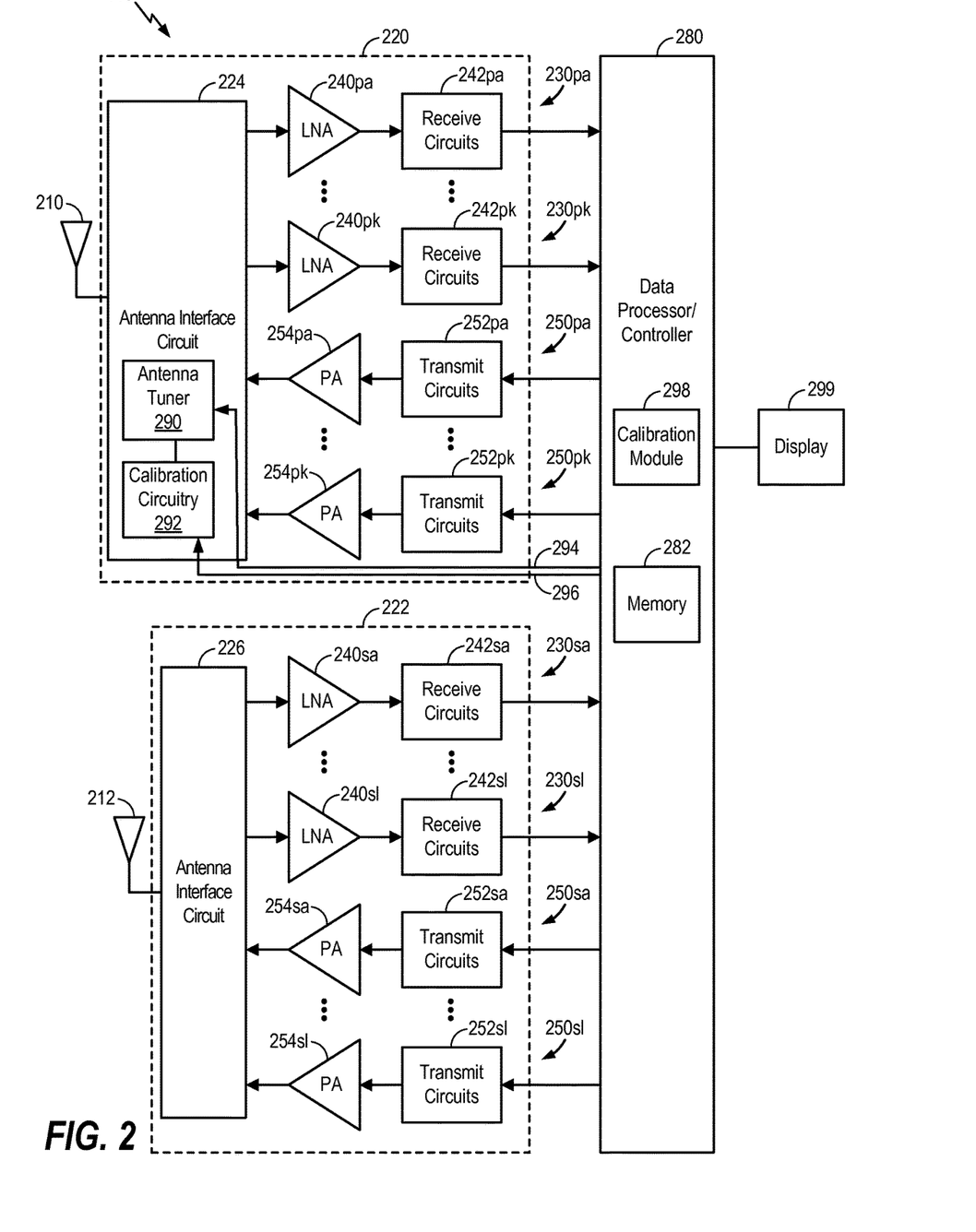
FIG. 2 shows a block diagram of the wireless device in FIG. 1 that includes an antenna tuner and calibration circuitry.

FIG. 2 shows a block diagram of an exemplary design of wireless device 110 in FIG. 1. In this exemplary design, wireless device 110 includes a transceiver 220 coupled to a primary antenna 210 via an antenna interface circuit 224, a transceiver 222 coupled to a secondary antenna 212 via an antenna interface circuit 226, and a data processor/controller 280. Transceiver 220 includes multiple (K) receivers 230*pa* to 230*pk* and multiple (K) transmitters 250*pa* to 250*pk* to support multiple frequency bands, multiple radio technologies, carrier aggregation, etc. Transceiver 222 includes multiple (L) receivers 230*sa* to 230*sl* and multiple (L) transmitters 250*sa* to 250*sl* to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230*pa* to 230*pk* and 230*sa* to 230*sl* includes one of the LNAs 240*pa* to 240*pk* or 240*sa* to 240*sl* and one of the receive circuits 242*pa* to 242*pk* or 242*sa* to 242*sl*. For data reception, antenna 210 receives signals from base stations and/or other transmitter stations and outputs a received RF signal, which is routed through the antenna interface circuit 224 and presented as an input RF signal to one or more of the receivers 230*pa* to 230*pk* and 230*sa* to 230*sl*, such as via a first input signal path to receiver 230*pa* or via a second input signal path to receiver 230*pk*. Antenna interface circuit 224 may include switches, duplexers, transmit filters, receive filters, matching circuits, etc.

The antenna interface circuit 224 includes an antenna tuner 290 that is coupled to calibration circuitry 292. The antenna tuner 290 may include one or more matching circuit components that may be programmable to have a particular impedance for matching an impedance of the antenna 210. The antenna tuner 290 is selectively enabled (e.g., at least a portion of the antenna tuner 290 is disabled during calibration). The calibration circuitry 292 is configured to selectively isolate (e.g., disconnect, electrically decouple, ground, etc.) the antenna 210 from one or more components of an RF path (e.g., the calibration circuitry 292 isolates the antenna 210 from the antenna tuner 290 during calibration and couples the antenna 210 to the antenna tuner 290 after calibration is completed). The antenna interface circuit 226 may also include an antenna tuner and calibration circuitry that operate in a similar manner as described for the antenna tuner 290 and the calibration circuitry 292, respectively. Exemplary embodiments of components that may be included in the antenna tuner 290 and the calibration circuitry 292 are described with respect to FIGS. 3-5.

The description below assumes that receiver 230*pa* is selected to receive an RF signal. The RF signal received from the antenna 210 via the antenna interface circuit 224 is sent to the LNA 240*pa*. Receive circuits 242*pa* downconvert the output RF signal that is output by the LNA 240*pa* from RF to baseband, amplify and filter the downconverted signal, and send an analog input signal to data processor/controller 280. Receive circuits 242*pa* may include mixers, filters, amplifiers, matching circuits, an oscillator, a local oscillator (LO) generator, a phase locked loop (PLL), etc. Each of the receivers 230*pa* to 230*pk* and 230*sa* to 230*sl* in transceivers 220 and 222 may operate in a similar manner as receiver 230*pa*.

In the exemplary design shown in FIG. 2, each of the transmitters 250*pa* to 250*pk* and 250*sa* to 250*sl* includes one of the transmit circuits 252*pa* to 252*pk* and 252*sa* to 252*sl* and one of the power amplifiers (PAs) 254*pa* to 254*pk* and 254*sa* to 254*sl*. For data transmission, data processor/controller 280 processes (e.g., encodes and modulates) data to be transmitted and sends an analog output signal to a selected transmitter. The description below assumes that transmitter 250*pa* is the selected transmitter. Within transmitter 250*pa*, transmit circuits 252*pa* amplify, filter, and upconvert the analog output signal from baseband to RF to generate a modulated RF signal. Transmit circuits 252*pa* may include amplifiers, filters, mixers, matching circuits, an oscillator, an LO generator, a PLL, etc. A PA 254*pa* receives and amplifies the modulated RF signal and sends a transmit RF signal having the proper output power level. The transmit RF signal is routed through antenna interface circuit 224 and transmitted via antenna 210. Each of the transmitters 250*pa* to 250*pk* and 250*sa* to 250*sl* in transceivers 220 and 222 may operate in a similar manner as transmitter 250*pa*.

FIG. 2 shows an exemplary design of receivers 230*pa* to 230*pk* and 230*sa* to 230*sl* and transmitters 250*pa* to 250*pk* and 250*sa* to 250*sl*. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240*pa* to 240*pk* and 240*sa* to 240*sl* and receive circuits 242*pa* to 242*pk* and 242*sa* to 242*sl* may be implemented on one module, which may be an RFIC, etc.

Data processor/controller 280 may perform various functions for wireless device 110. For example, data processor/controller 280 may perform processing for data being received via receivers 230*pa* to 230*pk* and 230*sa* to 230*sl* and data being transmitted via transmitters 250pa to 250pk and 250sa to 250sl. Data processor/controller 280 may control the operation of the various circuits within transceivers 220 and 222. For example, the data processor/controller 280 may send control signals, such as one or more antenna tuner control signals 294 and/or one or more calibration circuitry control signals 296, to selectively isolate the antenna 210 from a component of an RF path, such as by isolating the antenna 210 from the antenna tuner 290, upon initiation of a calibration operation. The data processor/controller 280 may include a calibration module 298 that is configured to receive signal values measured along an RF path (e.g., complex reflection coefficients) and to compute parameters characterizing the RF path (e.g., scattering parameters (S-parameters) of the RF path). The data processor/controller 280 may be configured to disable the calibration circuitry 292, re-couple the antenna 210 to the RF path and enable the antenna tuner 290, and determine an impedance of the antenna 210 by adjusting measurements of antenna impedance to compensate for characteristics of the RF path based on the computed parameters. Because the antenna tuner 290 and the calibration circuitry 292 may be selectively enabled, the antenna tuner 290 may be operational or the calibration circuitry 292 may be operational, and impedances can be accurately calibrated using virtually any known algorithm. After determining antenna impedance, the data processor/controller 280 may be configured to send a control signal to the antenna tuner 290 to adjust one or more variable impedance components to match (or substantially match) the antenna impedance. A memory 282 may store program codes and data for data processor/controller 280. A display 299 may be used to display information regarding calibration and/or antenna impedance, such as described in further detail with respect to FIG. 3. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas. Exemplary embodiments of components that may be used in the wireless device 110 are described in further detail with respect to FIGS. 3-9.

Figure 3:
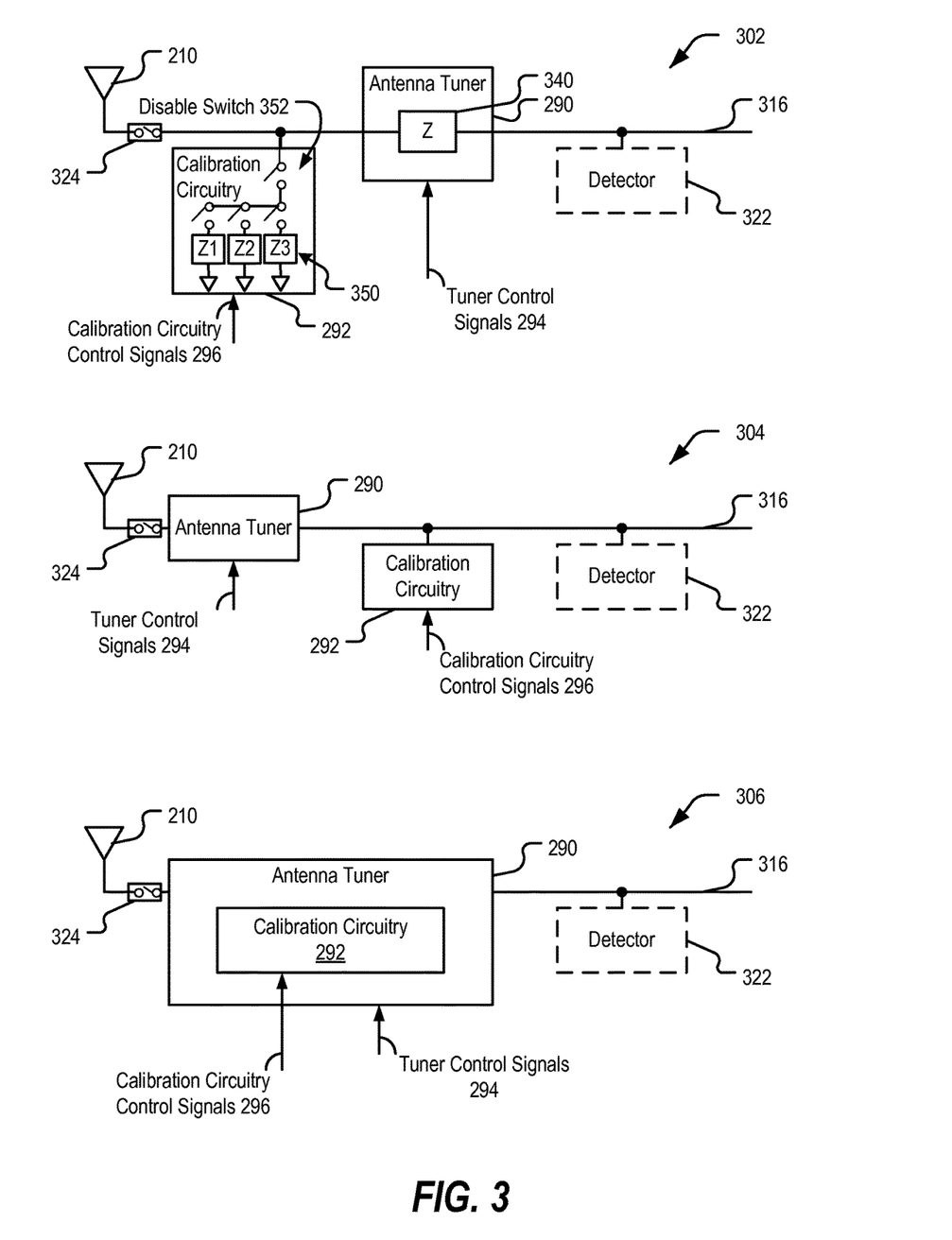
FIG. 3 shows block diagrams of exemplary embodiments of components including an antenna tuner and calibration circuitry that may be included in the wireless device of FIG. 1.

FIG. 3 illustrates components that may be included in the wireless device 110 in accordance with a first exemplary embodiment 302, a second exemplary embodiment 304, and a third exemplary embodiment 306. Each of the exemplary embodiments 302-306 includes the antenna tuner 290 and the calibration circuitry 292 that are coupled to the antenna 210 via an antenna port 324. The tuner 290 is selectively enabled and the calibration circuitry 292 is configured to be selectively enabled.

The first exemplary embodiment 302 illustrates that an output of the antenna tuner 290, the calibration circuitry 292, and the antenna 210 are coupled to the antenna port 324 along an RF path 316, such as a transmission path. A detector 322 may be coupled to the RF path 316 to measure signal properties on the RF path 316 during calibration operations and/or during "normal" (e.g., non-calibration) operations. For example, the RF path 316 may correspond to components of the transceiver 220 (e.g., transmission lines, electrical connections, circuit components, etc.) between the output of the power amplifier 254pa and the input of the antenna 210.

The tuner 290 is responsive to one or more of the antenna tuner control signals 294 to enable or disable one or more components of the antenna tuner 290 and/or to select a setting of one or more variable impedance components 340 of the antenna tuner 290. An exemplary embodiment of components that may be included in the antenna tuner 290 is illustrated in further detail with respect to FIG. 4. The calibration circuitry 292 is responsive to one or more of the calibration circuitry control signals 296 to enable or disable one or more components of the calibration circuitry 292 and/or to select a setting of one or more variable impedance components of the calibration circuitry 292 to couple one or more termination loads to the RF path 316.

For example, the RF path 316 may be prepared for a calibration operation by "disabling" the antenna tuner 290. "Disabling" the antenna tuner 290 may include configuring the antenna tuner 290, via the antenna tuner control signal(s) 294, to disable one or more components of the antenna tuner 290 to reduce an impedance of the antenna tuner 290. For example, one or more capacitive, inductive, and/or resistive components in the antenna tuner 290 may be decoupled from the RF path 316. As another example, "disabling" the antenna tuner 290 may include configuring the antenna tuner 290, via the antenna tuner control signal(s) 294, to a particular configuration for purposes of performing a calibration operation. To illustrate, a predetermined tuner configuration may be selected that has impedance characteristics that are "known" (e.g., measured and stored in the wireless device 110 to be accessible during calibration, such as stored in the memory 282 and retrievable by the data processor/controller 280 of FIG. 2). In this context, the antenna tuner 290 may be considered "disabled" because the predetermined tuner configuration is selected for its known characteristics and without regard for maintaining an impedance match to the antenna 210 during a calibration operation. Thus, the antenna tuner 290 (including one or more components of the antenna tuner 290) is configured to be selectively enabled.

In the first exemplary embodiment 302, the calibration circuitry 292 is between the antenna 210 and the antenna tuner 290, and the antenna tuner 290 is part of the RF path 316 to characterize by calibration. In some implementations, characterization may be performed for every tuner state (e.g., using each combination of a switched capacitance and a switched inductance in the antenna tuner 290). In other implementations, characterization may be performed for a set of tuner states (e.g., selected combinations of a switched capacitance and a switched inductance in the antenna tuner 290), such as when the number of possible combinations is too large for efficient calibration of all combinations of switched tuner components.

The calibration circuitry 292 may be selectively enabled, such as via a switch 352 that is responsive to the calibration circuitry control signal(s) 296 to couple or decouple one or more switched termination loads 350 to the RF path 316. When enabled, the calibration circuitry 292 may further be responsive to the calibration circuitry control signal(s) 296 to select one or more termination loads to be coupled to the RF path 316. For example, the calibration circuitry 292 may include a switch that couples the RF path 316 to ground via a first reference or "known" load that has a relatively low impedance (e.g., a "short" load "Z1" having an impedance value that has been measured and stored in the wireless device 110 to be accessible during calibration, such as stored in the memory 282 and retrievable by the data processor/controller 280 of FIG. 2). The calibration circuitry 292 may include a switch that couples the RF path 316 to a second reference or "known" load (e.g., a load "Z2" having an impedance value that has been measured and stored in the wireless device 110 to be accessible during calibration, such as stored in the memory 282 and retrievable by the data processor/controller 280 of FIG. 2). The calibration circuitry 292 may include one or more switches that decouple the RF path 316 from ground or that couple the RF path 316 to a third reference or "known" load that has a relatively large impedance (e.g., an "open" load "Z3" having an impedance value that has been measured and stored in the wireless device 110 to be accessible during calibration, such as stored in the memory 282 and retrievable by the data processor/controller 280 of FIG. 2). The calibration circuit 292 may therefore be configured to selectively couple a first termination impedance (Z1) to the RF path 316, to selectively couple a second termination impedance (Z2) to the RF path 316, and to selectively couple a third termination impedance (Z3) to the RF path 316.

The calibration circuitry 292 may further be configured to selectively isolate the antenna 210 from a component of the RF path 316. For example, the calibration circuitry 292 may be configured to selectively isolate the antenna 210 from the antenna tuner 290 and/or from a transmitter, such as the transmitter 250pa of FIG. 2, during calibration. For example, the calibration circuitry 292 may include a switch at the antenna port 324 that is configured to selectively disconnect the antenna 210 from the RF path 316 or may include a switch that is configured to selectively couple the antenna port 324 to ground, as illustrative, non-limiting examples.

The second exemplary embodiment 304 illustrates the calibration circuitry 292 coupled to the RF path 316 at an input of the antenna tuner 290. In the second exemplary embodiment 304, the antenna tuner 290 may be disabled by decoupling the input of the antenna tuner 290 from the RF path 316 (e.g., via a switch at an input of the antenna tuner 290) or by configuring the antenna tuner 290, via the antenna tuner control signal(s) 294, to a particular "known" configuration for purposes of performing a calibration operation, as illustrative, non-limiting examples. The calibration circuitry 292 may operate to selectively isolate the antenna 210 (and in some implementations, the antenna tuner 290) from the RF path 316 and to selectively couple one or more known loads to the RF path 316 (e.g., a "short" reference impedance, an "open" reference impedance, and/or a "load" reference impedance), such as described with reference to the first exemplary embodiment 302.

In the second exemplary embodiment 304, the calibration circuitry 292 is at the input to the antenna tuner 290, and the antenna tuner 290 is not part of the RF path to characterize by calibration. In some implementations, the antenna tuner 290 and the antenna 210 are isolated from a component of the RF path 316, such as when the control circuitry 292 decouples an input of the antenna tuner 290 from the RF path 316 (e.g., as described in further detail with respect to FIG. 8). In other implementations, the antenna tuner 290 may be set to a high impedance state to have reduced influence (or no influence) on calibration accuracy or may be set to a predetermined setting that has a "known" influence on the calibration loads. In some implementations, one or more particular settings (e.g., a "known" configuration) of the antenna tuner 290 may be used to set one or more terminating loads of the RF path 316 during calibration.

The third exemplary embodiment 306 illustrates the calibration circuitry 292 included in the antenna tuner 290. For example, the calibration circuitry 292 may be configured to selectively isolate the antenna 210 from a component of the RF path 316 (e.g., from a transmitter, such as the transmitter 250pa of FIG. 2) and may include one or more impedance components and/or switching components that may be configured to bypass or to supplement an impedance of one or more components of the antenna tuner 290. The calibration circuitry 292 may be configured to re-purpose one or more components of the antenna tuner 290 during calibration, such as one or more electrostatic discharge devices (ESDs) of the antenna tuner 290, as described in further detail with respect to FIGS. 7-9.

Although FIG. 3 depicts three different locations of the calibration circuitry 292 relative to the antenna tuner 290, in other implementations components of the calibration circuitry 292 may be in multiple locations along the RF path 316. For example, a first portion of the calibration circuitry 292 may be coupled to the input of the antenna tuner 290 and a second portion of the calibration circuitry 292 may be coupled to the antenna port 324 (i.e., at the output of the antenna tuner 290). As another example, components of the calibration circuitry 292 may be located at the input of the antenna tuner 290, at the output of the antenna tuner 290, and within the antenna tuner 290.

The calibration circuitry 292 may be controlled via the calibration circuitry control signal(s) 296 to enable characterization of at least a portion of the RF path 316 by performing measurements at the RF path using the detector 322 while the antenna 210 is isolated from the RF path 316 and one or more selected calibration impedances (that may include one or more predetermined configurations of the antenna tuner 290) are coupled to the RF path 316 as a terminal load. Characterizing the RF path 316 enables more accurate determination of an impedance of the antenna 210 and determination of an appropriate configuration of the antenna tuner 290 for impedance matching with the antenna 210.

Figure 4:
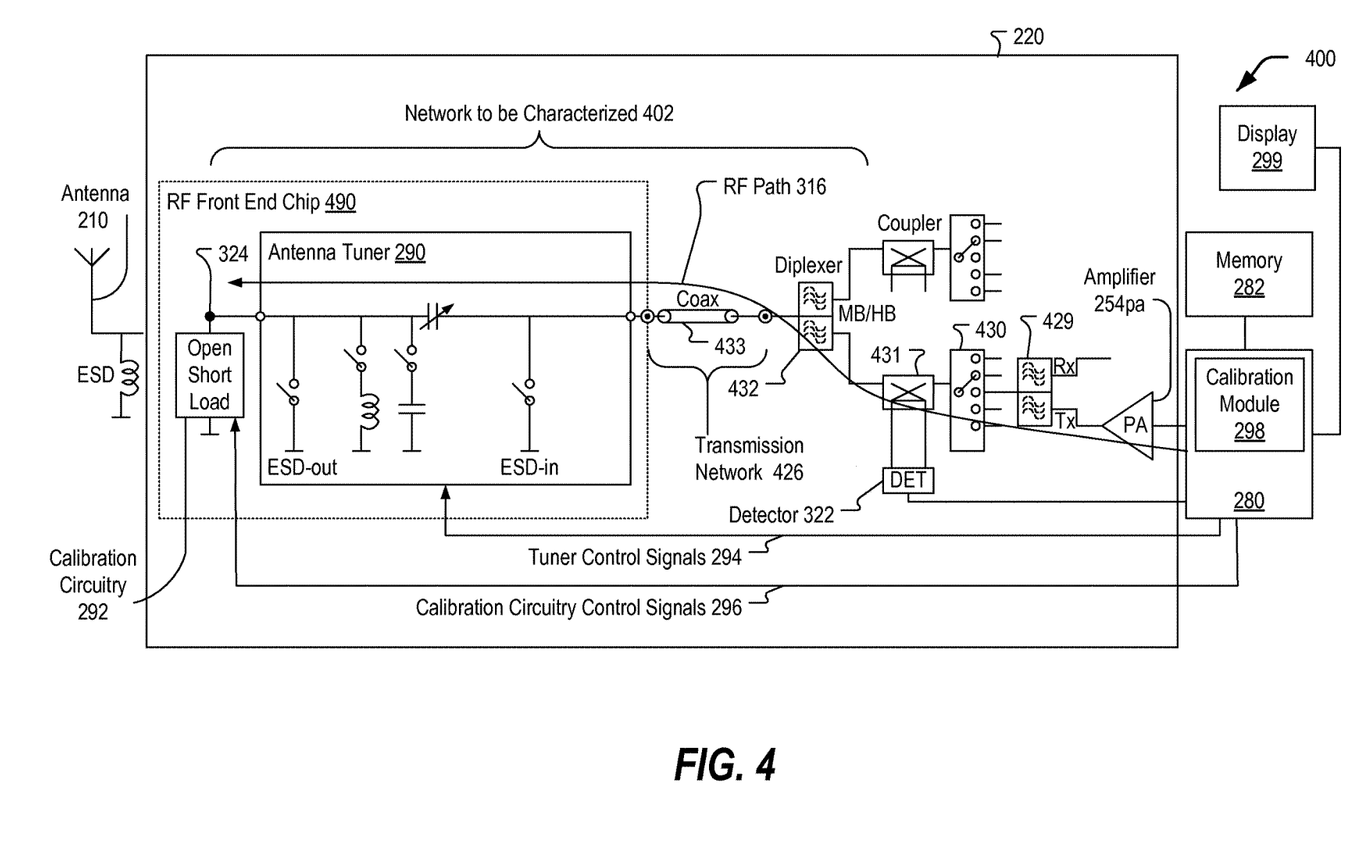
FIG. 4 shows a block diagram of another exemplary embodiment of components including an antenna tuner and calibration circuitry that may be included in the wireless device of FIG. 1.

FIG. 4 illustrates an apparatus 400 that includes the antenna tuner 290 and the calibration circuitry 292 that is coupled to the antenna tuner 290. An amplifier, such as the amplifier 254pa of FIG. 2, generates an output signal that is sent via a transmission network 426 (e.g., a coaxial line) to the antenna tuner 290. For example, the amplifier 254pa and the detector 322 may be in the transceiver 220, and the antenna tuner 290 and the calibration circuitry 292 may be in an RF front end chip 490 that is coupled to the transceiver 220 via the transmission network 426. An antenna 210 may be coupled to the antenna port 324 at an output of the antenna tuner 290.

The tuner 290 is responsive to the one or more tuner control signals 294 and may be selectively enabled. The calibration circuitry 292 is responsive to the one or more calibration circuitry control signals 296 and is capable of being selectively enabled. The calibration circuitry 292 is configurable to selectively couple calibration loads as termination impedances to the RF path 316. The detector 322 is in the RF path 316 and located near the amplifier 254pa, such as on a transceiver chip. The RF path 316 may include a set of components and interconnections between the components, such as the amplifier 254pa, a diplexer 429, a switch 430, a coupler 431 that is coupled to the detector 322, a diplexer 432, the transmission network 426 including a transmission line 433 (e.g., a coaxial cable or a micro-strip line across a printed circuit board (PCB)), the RF front end chip 490 including the antenna tuner 290, and the antenna port 324 as an illustrative, non-limiting example. The RF path 316 is configured to propagate a signal from an RF source (e.g., the data processor/controller 280 or the amplifier 245pa) to the antenna port 324.

The detector 322 may be located remote from the antenna tuner 290, such as across a PCB, to enable performing measurements that may be used for characterization of the circuit between the detector 322 and the antenna 210 (e.g., including the diplexer 432, the transmission network 426, the antenna tuner 290, one or more additional transmission lines, parasitics, etc.). The position of the detector 322 near the amplifier 254pa enables unwanted frequency components that may be present near the antenna tuner 290 to be filtered and/or attenuated before reaching the detector 322, resulting in a more accurate measurement of the signal at the frequency of interest (e.g., measurement of a component of a signal at the detector 322 that has a frequency corresponding to a carrier frequency of a transmitted signal) as compared to positioning the detector 322 near the antenna 210. Other portions of the RF path 316 (e.g., the coupler 431, the switch 430, the diplexer 429, and the amplifier 254pa) may be separately characterized to generate characterization data that is stored for use during a calibration operation. For example, the characterization data may be stored in the memory 282 and accessed by the calibration module 298 of the data processor/controller 280.

During a calibration process, the antenna 210 may be isolated from a component of the RF path 316, such as by the calibration circuitry 292 decoupling the antenna 210 from the antenna tuner 290. A first calibration load (e.g., open or short) may be applied by the calibration circuitry 292 in a first configuration, and the detector 322 may measure first signal characteristics (e.g., to determine complex reflection coefficients). After measuring the first signal characteristics, a second calibration load may be applied by the calibration circuitry 292 in a second configuration, and the detector 322 may measure second signal characteristics. After measuring the second signal characteristics, a third calibration load may applied by the calibration circuitry 292 in a third configuration, and the detector 322 may measure third signal characteristics. The antenna 210 may be electrically (or physically) decoupled from the antenna tuner 290 during calibration, such as described in FIG. 5. Although FIG. 4 illustrates the calibration loads as "open," "short," and "load" (e.g., 50 ohms), any three or more "known" calibration loads (i.e., loads whose impedance values have been measured and stored to be accessible during calibration) may be used.

The signal characteristics measured by the detector 322 may be used by the calibration module 298 to characterize (e.g., determine S-parameters for) the circuit including the transmission network 426, the antenna tuner 290, and any contacts or other parasitic impedances as a single network to be characterized 402. For example, 5-parameters of the network to be characterized 402 may be determined from measurements using three known calibration loads in accordance with:

$$\begin{bmatrix} 1 & \rho_{S1}\rho_{L1} & \rho_{L1} \\ 1 & \rho_{S2}\rho_{L2} & \rho_{L2} \\ 1 & \rho_{S3}\rho_{L3} & \rho_{L3} \end{bmatrix} \begin{bmatrix} s_{11} \\ s_{22} \\ \Delta \end{bmatrix} = \begin{bmatrix} \rho_{S1} \\ \rho_{S3} \\ \rho_{S3} \end{bmatrix}, \Delta = s_{21}^2 - s_{11}s_{22}. \quad \text{(Equation 1)}$$

where $\rho_L$ and $\rho_S$ represent the known loads and measured reflection coefficients measured at the source (reflection coefficients at the input of the RF path to be characterized), respectively.

In some implementations, the detector 322 measures complex reflection coefficients with each of the loads that are selectively coupled by the calibration circuitry 292 to the RF path 316. The complex reflection coefficients corresponding to three (or more) "known" loads enables the circuit between the detector 322 and the antenna 210 (e.g., the network to be characterized 402), which may be modelled in terms of three unknown S-parameters $S_{11}$, $S_{22}$, and $S_{21}$, to be characterized mathematically. Modelling the network to be characterized 402 as a single network simplifies characterization by incorporating components, interconnections, parasitics, etc., that may otherwise be difficult to individually model.

The detector 322 may be located close to the amplifier 254pa, enabling locking of the detector 322 to the correct frequency (e.g., a transmit frequency used during calibration). Measurement of the complex reflection coefficients by the detector 322 may be performed by disconnecting or otherwise electrically isolating the antenna 210 and configuring the calibration circuitry 292 to insert "known" loads at the output of the antenna tuner 290 (or integrated into the antenna tuner 290). The complex reflection coefficients can be used to compute the antenna impedance. The detector 322 may also be used to measure power. The measured power may be used to compute power delivered to the antenna 210 while the antenna 210 is connected and used for transmission.

Characterizing the circuit between the detector 322 and the antenna 210 and subsequent detector measurements performed during calibration allow calculation of the antenna impedance. Characterizing the circuit between the detector 322 and the antenna 210 also enables the power delivered to the antenna 210 to be calculated without performing measurements of radiated power.

To illustrate, the antenna reflection coefficient may be obtained according to Equation 2:

$$\rho_L = \frac{\rho_S - s_{11}}{(s_{12}s_{21} + \rho_S s_{22} - s_{11}s_{22})} \quad \text{(Equation 2)}$$

In Equation 2, $\rho_S$ represents the reflection coefficient at the source and $S_{11}$, $S_{12}$, $S_{21}$, and $S_{22}$ represent the S-parameters of the characterized RF-path. During signal transmission with the antenna tuner 290 at a set state, a reflection coefficient is measured by the detector 322 and the reflection coefficient (impedance) of the antenna 210 is computed using the S-parameters that were stored in memory after the calibration.

After determining the antenna reflection coefficient, the power delivered to the antenna can be computed according to Equation 3:

$$P_L = P_A \frac{(1 - |\rho_S|^2)(1 - |\rho_L|^2)|s_{21}|^2}{|(1 - \rho_S s_{11})(1 - \rho_L s_{22}) - s_{12}s_{21}\rho_S\rho_L|^2} \quad \text{(Equation 3)}$$

In Equation 3, $P_L$ is the power delivered to the antenna and $P_A$ is the available power from the source.

Since the circuit between the antenna 210 and the detector 322 can be determined for all conditions of the antenna tuner 290, an antenna tuner setting can be calculated and directly applied (e.g., via the antenna tuner control signal(s) 294) for any detector reading and without perturbing cables of the apparatus 400. For example, Equation 3 may be evaluated for each of the antenna tuner states to determine which tuner state results in a highest delivered power $P_L$ of the evaluated tuner states. The tuner 290 may be set to the determined tuner state. Evaluation of the antenna tuner states may be repeated if an adaptive tuner process is used.

In some implementations, antenna impedance can be displayed by the wireless device 110 of FIG. 1 alongside other performance metrics, such as at the display 299 of the wireless communication device 110. In addition, or alternatively, the wireless communication device 110 may send measured information or performance metric information to an external device for processing and/or display of the information. Such information may include a detected reflection coefficient, power, mismatch information, characterized S-parameters, an antenna impedance, delivered power corresponding to an antenna tuner state, or a combination thereof, as an illustrative, non-limiting example.

By using one or more impedances of the calibration circuitry 292 (and, in some implementations, the antenna tuner 290) as known loads used to characterize the portion of the RF path 316 between the detector 322 and the antenna port 324, a setting of the antenna tuner 290 for any tuner condition may be directly calculated, avoiding the delay and signal impact associated with using an adaptive searching algorithm.

Figure 5:
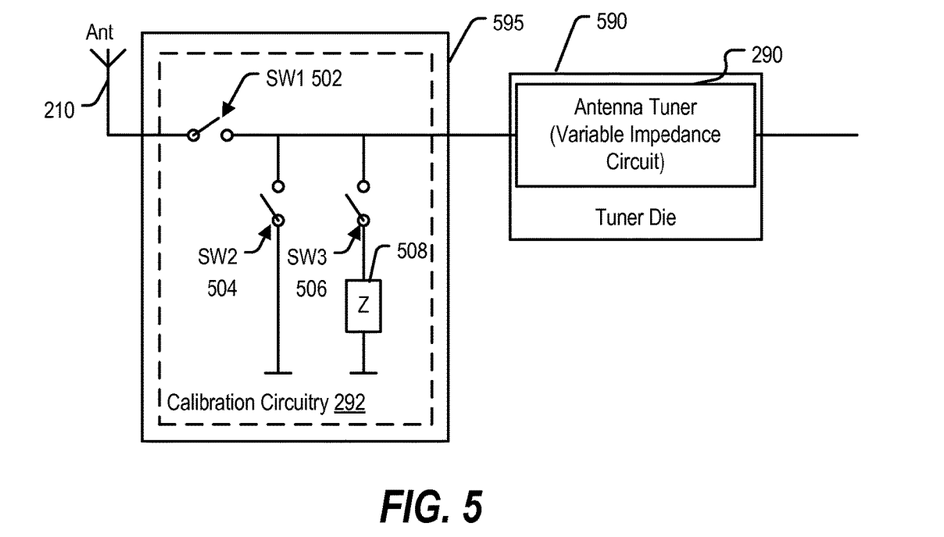
FIG. 5 shows a diagram of an exemplary embodiment of components including an antenna tuner and calibration circuitry that may be included in the wireless device of FIG. 1.

FIG. 5 illustrates an example of the antenna tuner 290 of FIG. 2 on an antenna tuner die 590 and the calibration circuitry 292 of FIG. 2 on another die 595. The calibration circuitry 292 includes a first switch SW1 502 having a first terminal coupled to the antenna 210 and a second terminal coupled to a first terminal of a second switch SW2 504, to a first terminal of a third switch SW3 506, and to the antenna tuner 290. A second terminal of SW2 504 is coupled to ground. A second terminal of SW3 is coupled to an impedance load 508, such as one of the switched termination loads 350 of FIG. 3. During normal (i.e., non-calibration) operation, SW1 502 is closed (i.e., activated) and SW2 504 and SW3 506 are open (i.e., deactivated).

During calibration, SW1 502 is opened (i.e., deactivated) to isolate the antenna 210 from the antenna tuner 290 to eliminate (or reduce) an impact of antenna impedance. Calibration is performed for a "SHORT" termination condition with SW2 504 closed and SW3 506 open. Calibration is performed for an "OPEN" termination condition with SW2 504 and SW3 506 open. Calibration is performed for a "LOAD" termination with SW2 504 open and SW3 506 closed.

Because the calibration circuitry 292 is between the antenna 210 and the antenna tuner 290, the antenna tuner 290 is part of the RF path to be characterized. Characterization may be performed for each tuner state (or alternatively, for a subset of the antenna tuner states).

Figure 6:
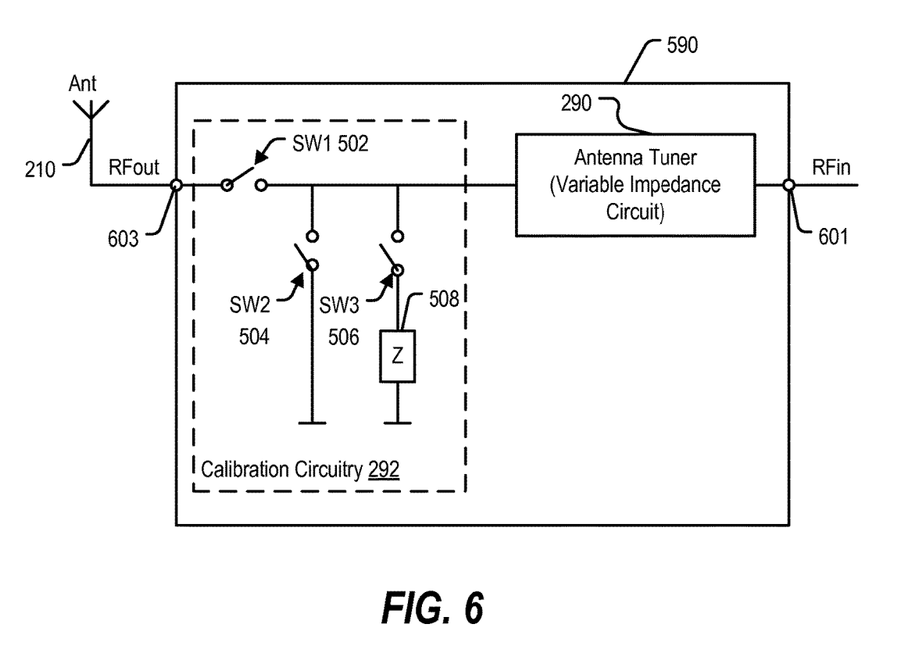
FIG. 6 shows a diagram of another exemplary embodiment of components including an antenna tuner and calibration circuitry that may be included in the wireless device of FIG. 1.

FIG. 6 illustrates an example of the antenna tuner 290 and the calibration circuitry 292 of FIG. 2 implemented on the antenna tuner die 590 of FIG. 5. The tuner 290 is coupled to an RF input 601 and the antenna 210 is coupled to an RF output 603. The calibration circuitry 292 is coupled to the antenna tuner 290 and to the RF output 603. The calibration circuitry 292 includes the switches SW1 502, SW2 504, SW3 506 and the impedance load 508 of FIG. 5. During normal (i.e., non-calibration) operation, SW1 502 is closed and SW2 504 and SW3 506 are open.

During calibration, SW1 502 is opened to isolate the antenna 210 from the antenna tuner 290 to eliminate (or reduce) an impact of antenna impedance. Calibration is performed for a "SHORT" termination condition with SW2 504 closed and SW3 506 open. Calibration is performed for an "OPEN" termination condition with SW2 504 and SW3 506 open. Calibration is performed for a "LOAD" termination with SW2 504 open and SW3 506 closed.

Because the calibration circuitry 292 is between the antenna 210 and the antenna tuner 290, the antenna tuner 290 is part of the RF path to be characterized. Characterization may be performed for every tuner state (or alternatively, for a subset of tuner sets).

Figure 7:
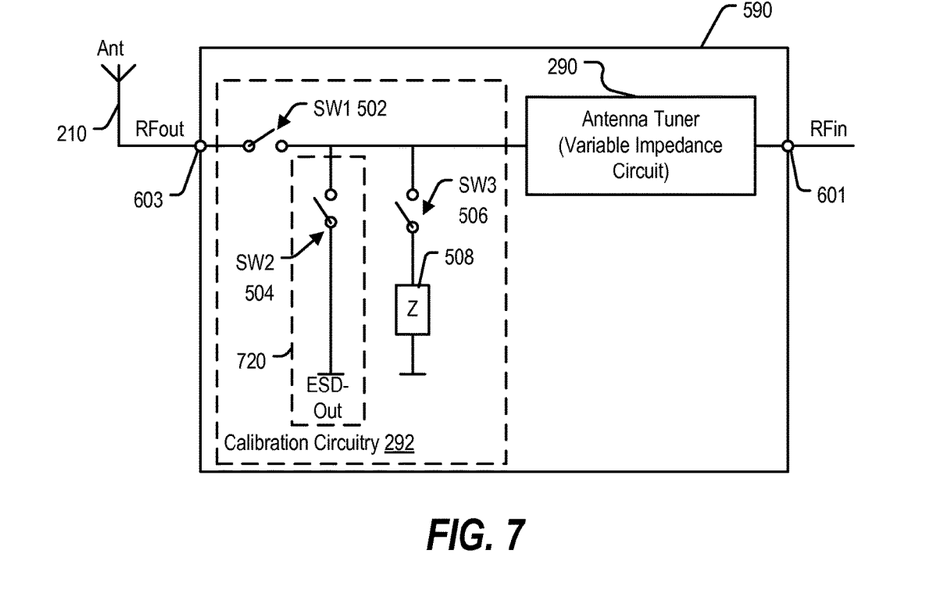
FIG. 7 shows a diagram of another exemplary embodiment of components including an antenna tuner and calibration circuitry that may be included in the wireless device of FIG. 1.

FIG. 7 illustrates an example of the antenna tuner 290 and the calibration circuitry 292 of FIG. 2 in which the calibration circuitry 292 includes at least a portion of an output electrostatic discharge device (ESD-Out) 720. The tuner 290 and the antenna 210 are implemented on the antenna tuner die 590 of FIG. 5 and are coupled to the RF input 601 and to the RF output 603 of FIG. 6, respectively. The calibration circuitry 292 includes the switches SW1 502, SW2 504, SW3 506 and the impedance load 508 of FIG. 5.

ESD-Out may include one or more field effect transistors (FETs), such as a series configuration of FETs, that are normally in an OFF state (i.e., deactivated). As illustrated in FIG. 7, SW2 504 may include one or more FETs of ESD-Out 720 that are controlled to selectively couple or decouple the output of the antenna tuner 290 to ground.

During normal operation, SW1 502 is closed and SW2 504 and SW3 506 are open. During calibration, SW1 502 is opened to isolate the antenna 210 from the antenna tuner 290 to eliminate (or reduce) an impact of antenna impedance. Calibration is performed for a "SHORT" termination condition with SW2 504 closed and SW3 506 open. Calibration is performed for an "OPEN" termination condition with SW2 504 and SW3 506 open. Calibration is performed for a "LOAD" termination with SW2 504 open and SW3 506 closed.

Because the calibration circuitry 292 is between the antenna 210 and the antenna tuner 290, the antenna tuner 290 is part of the RF path to be characterized. Characterization may be performed for each tuner state (or alternatively, for a subset of the antenna tuner states).

Using switchable FETs (e.g., FETs that can be selectively opened or closed) of ESD-Out 720 as SW2 504 enables the calibration circuitry 292 to be implemented using existing components on the antenna tuner die 590. As a result, die area used by the calibration circuitry 292 may be conserved.

Figure 8:
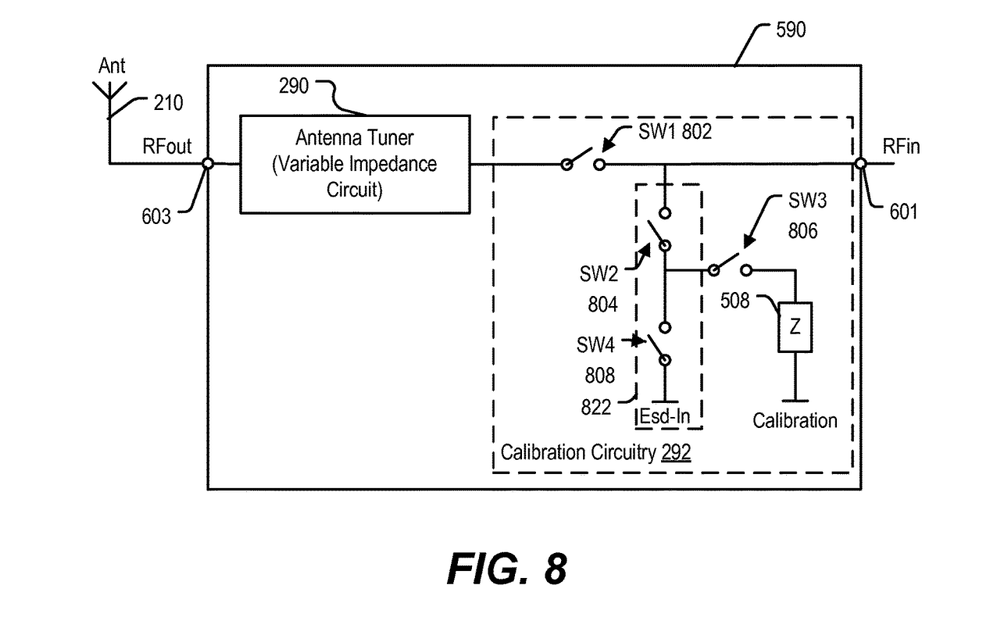
FIG. 8 shows a diagram of another exemplary embodiment of components including an antenna tuner and calibration circuitry that may be included in the wireless device of FIG. 1.

FIG. 8 illustrates an example of the antenna tuner 290 and the calibration circuitry 292 of FIG. 2 in which the calibration circuitry 292 includes at least a portion of an input electrostatic discharge device (ESD-In) 822. The tuner 290 and the antenna 210 are implemented on the antenna tuner die 590 and are coupled to the RF output 603. The calibration circuitry 292 is coupled to the RF input 601.

The calibration circuitry 292 includes a first switch SW1 802 having a first terminal coupled to the antenna tuner 290 and having a second terminal coupled to the RF input 601 and to a second switch SW2 804. A third switch SW3 806 and the termination load 508 are serially coupled between the second switch SW2 804 and ground. A fourth switch SW4 808 is also coupled between the second switch SW2 804 and ground.

ESD-In 822 includes multiple FETs that are normally in an OFF state. As illustrated in FIG. 8, SW2 804 may include one or more FETs of ESD-In 822 that are controlled to be selectively opened or closed. Similarly, SW4 808 may include one or more FETs of ESD-In 822 that are controlled to be selectively opened or closed.

During normal operation, SW1 802 is closed and SW2 804 is open. During calibration, SW1 802 is opened to eliminate an impact of antenna impedance and tuner impedance by isolating the antenna 210 and the antenna tuner 290 from the rest of the RF path. Calibration is performed for a "SHORT" termination condition with SW2 804 and SW4 808 closed and SW3 806 open. Calibration is performed for an "OPEN" termination condition with SW2 804 open.

Calibration is performed for a "LOAD" termination with SW2 804 and SW3 806 closed and SW4 808 open.

Because the antenna tuner 290 is between the calibration circuitry 292 and the antenna 210, the antenna tuner 290 is not part of the RF path to be characterized. Characterization for tuner states may be omitted.

Using switchable FETs (e.g., FETs that can be selectively opened or closed) of ESD-In 822 as SW2 804 and SW4 808 enables the calibration circuitry 292 to be implemented using existing components on the antenna tuner die 590. As a result, die area used by the calibration circuitry 292 may be conserved.

Figure 9:
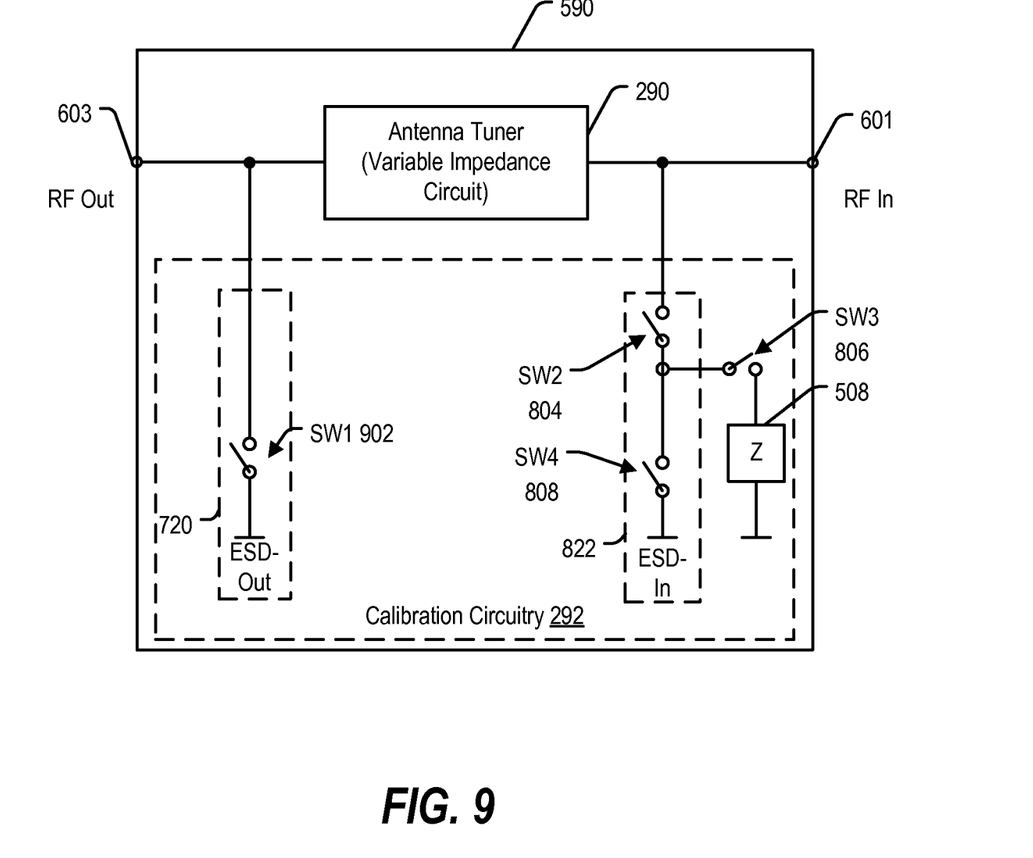
FIG. 9 shows a diagram of another exemplary embodiment of components including an antenna tuner and calibration circuitry that may be included in the wireless device of FIG. 1.

FIG. 9 illustrates an example of the antenna tuner 290 and the calibration circuitry 292 in which the calibration circuitry 292 includes at least a portion of the input ESD (ESD-In) 822 and the output ESD (ESD-Out) 720. The tuner 290 is implemented on the antenna tuner die 590 and is coupled to the RF input 601 and to the RF output 603. The calibration circuitry 292 is also coupled to the RF input 601 and to the RF output 603.

The calibration circuitry 292 includes a first switch SW1 902 having a first terminal coupled to the RF output 603 and a second terminal coupled to ground. The second switch SW2 804 is coupled to the RF input 601. The third switch SW3 806 and the termination load 508 are serially coupled between the second switch SW2 804 and ground. The fourth switch SW4 808 is also coupled between the second switch SW2 804 and ground. ESD-Out 720 includes SW1 902, and ESD-In 822 includes SW2 804 and SW4 808.

During normal operation, SW1 902 is open and SW2 804 is open. During calibration, SW1 902 is closed to isolate the antenna 210 from the antenna tuner 290 to reduce or eliminate an impact of antenna impedance. In addition, during calibration, the antenna tuner 290 may be disabled by configuring the antenna tuner 290 to have a high-impedance state for signals received at the RF input 601. Calibration is performed for a "SHORT" termination condition with SW2 804 and SW4 808 closed and SW3 806 open. Calibration is performed for an "OPEN" termination condition with SW2 804 open. Calibration is performed for a "LOAD" termination with SW2 804 and SW3 806 closed and SW4 808 open. The tuner 290 is not part of the RF path to be characterized, and characterization for tuner states may be omitted.

Using switchable FETs (e.g., FETs that can be selectively opened or closed) of ESD-Out 720 and ESD-In 822 enables the calibration circuitry 292 to be implemented using existing components on the antenna tuner die 590. As a result, die area used by the calibration circuitry 292 may be conserved.

Figure 10:
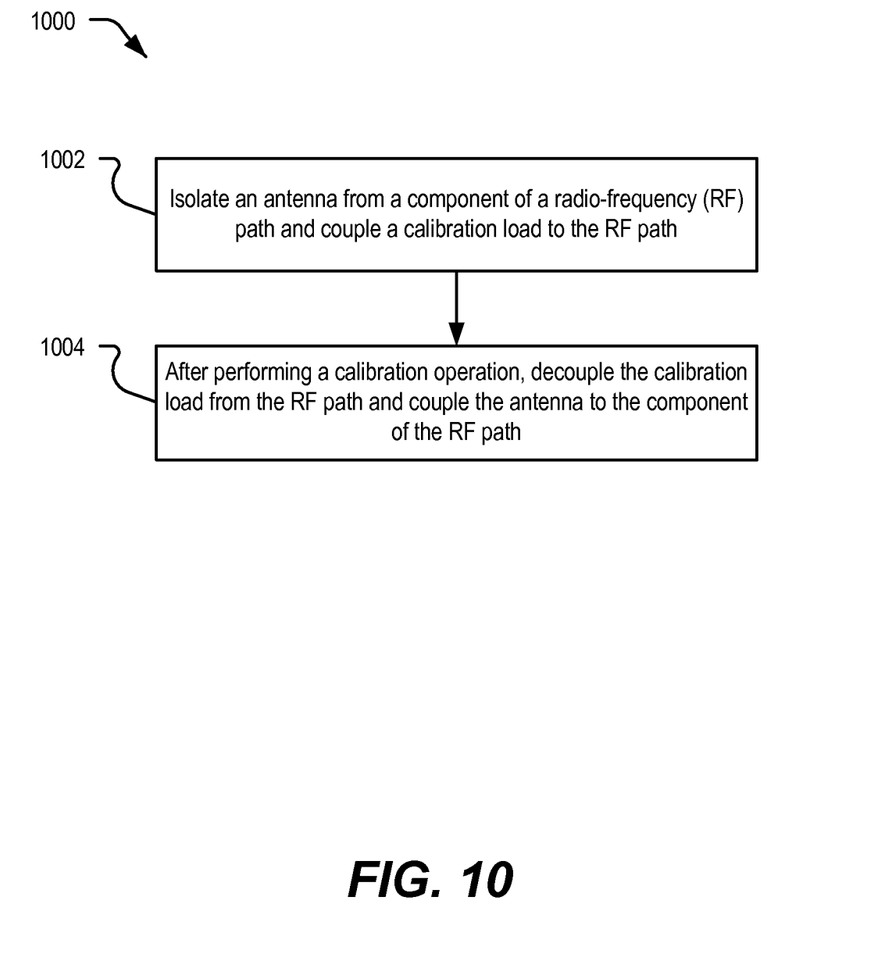
FIG. 10 illustrates a flowchart of a method that may be performed by the wireless device of FIG. 1.

An exemplary method 1000 that may be performed in the wireless device 110 of FIG. 1 is shown in FIG. 10. The method 1000 includes isolating an antenna from a component of an RF path and coupling a calibration load to the RF path, at 1002. For example, isolating the antenna from the component of the RF path may be performed by opening a switch to decouple the antenna from an antenna tuner and/or from a transmitter, grounding an antenna port, or grounding an antenna tuner input, as illustrative, non-limiting examples. Coupling the calibration load to the RF path may include coupling a first termination impedance (e.g., a "short" load) to the RF path. The method 1000 may also include coupling a second termination impedance (e.g., a 50-Ohm load) to the RF path, and coupling a third termination impedance (e.g., an "open" load) to the RF path.

After performing a calibration operation, the calibration load may be decoupled from the RF path and the antenna may be coupled to the component of the RF path, at 1004. For example, the calibration operation may be controlled by the calibration module 298 of FIGS. 2 and 4 and may include computing S-parameters of the portion of an RF path between a detector and an antenna port, such as S-parameters corresponding to the network to be characterized 402 of FIG. 4. Characterization of the RF path enables antenna impedance measurements to be adjusted to compensate for an impact of the transmission network to determine a more accurate antenna impedance and an accurate setting of the antenna tuner for impedance matching during the calibration operation.

In conjunction with the described embodiments, an apparatus may include means for propagating a signal from a RF source to an antenna port. For example, the means for propagating may include one or more of the transmitters 250pa to 250pk or 250pa to 250sl of FIG. 2, the transmit circuits 252pa to 252pk or 252sa to 252sl of FIG. 2, the PAs 254pa to 254pk or 254sa to 254sl of FIG. 2, the antenna interface circuit 224 of FIG. 2, the antenna tuner 290 of FIGS. 2-7 or FIG. 9, all or part of the RF path 316 of FIGS. 3-4, one or more other components and/or interconnections, or any combination thereof.

The means for propagating includes a means for adjusting an impedance. For example, the means for adjusting an impedance may include the antenna tuner 290 of FIGS. 2-9, one or more other devices, circuits, or any combination thereof.

The means for propagating may include means for amplifying. For example, the means for amplifying may include one or more of the amplifiers 254pa to 254pk of FIG. 2, the amplifier 254pa of FIG. 4, one or more other devices, circuits, or any combination thereof.

The apparatus may also include means for selectively isolating an antenna from a component of the means for propagating. For example, the means for selectively isolating may include the calibration circuitry 292 of FIGS. 2-9, the antenna port 324 of FIGS. 3-4, the first switch 502 of FIGS. 5-7, the first switch 802 of FIG. 8, the first switch 902 of FIG. 9, one or more other devices, circuits, or any combination thereof.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a radio-frequency (RF) path that includes an antenna tuner; and
calibration circuitry coupled to the antenna tuner, the calibration circuitry comprising a switched load and configured to selectively isolate an antenna from a component of the RF path.

2. The apparatus of claim 1, wherein the calibration circuitry includes an electrostatic discharge device (ESD) coupled to an input or an output of the antenna tuner.

3. The apparatus of claim 1, wherein the component includes the antenna tuner.

4. The apparatus of claim 1, wherein the calibration circuitry is configured to terminate the RF path between the antenna and the component.

5. The apparatus of claim 1, wherein the RF path includes a set of components and interconnections configured to propagate a signal from an RF source to an antenna port.

6. The apparatus of claim 1, wherein the calibration circuitry is configurable to couple a first termination impedance to the RF path in a first configuration of the calibration circuitry, to couple a second termination impedance to the RF path in a second configuration of the calibration circuitry, and to couple a third termination impedance to the RF path in a third configuration of the calibration circuitry.

7. The apparatus of claim 1, further comprising a detector coupled to the RF path.

8. The apparatus of claim 7, wherein the RF path includes a transmission network between an amplifier and the antenna tuner, and wherein the detector is coupled to the RF path between the amplifier and the transmission network.

9. The apparatus of claim 7, wherein the detector is remote from the antenna tuner to enable characterization of a circuit between the detector and the antenna.

10. The apparatus of claim 9, wherein the circuit includes a transmission line across a printed circuit board.

11. An apparatus comprising:
means for propagating a signal from a radio-frequency (RF) source to an antenna port, the means for propagating including a means for adjusting an impedance; and
means for selectively isolating an antenna from a component of the means for propagating, the means for selectively isolating comprising a switched load.

12. The apparatus of claim 11, wherein the means for selectively isolating includes an electrostatic discharge device (ESD) coupled to an input or an output of the means for adjusting.

13. The apparatus of claim 11, wherein the means for propagating includes means for amplifying, and wherein the means for selectively isolating is configurable to selectively couple a first termination impedance to the means for propagating, to selectively couple a second termination impedance to the means for propagating, and to selectively couple a third termination impedance to the means for propagating.

14. The apparatus of claim 13, wherein the means for propagating includes a transmission network between the means for amplifying and the means for selectively isolating, and further comprising a detector coupled to the means for propagating between the means for amplifying and the transmission network.

15. The apparatus of claim 11, further comprising a detector that is remote from the means for selectively isolating to enable characterization of a circuit between the detector and the antenna.

16. The apparatus of claim 11, wherein the means for propagating includes a transmission line across a printed circuit board.

17. A method comprising:
isolating, using calibration circuitry that includes a switched load, an antenna from a component of a radio-frequency (RF) path and coupling a calibration load to the RF path; and
after performing a calibration operation, decoupling the calibration load from the RF path and coupling the antenna to the component of the RF path.

18. The method of claim 17, wherein coupling the calibration load to the RF path includes coupling a first termination impedance to the RF path, and further comprising:
coupling a second termination impedance to the RF path; and
coupling a third termination impedance to the RF path.

19. The method of claim 17, further comprising displaying mismatch information, characterized S-parameters, an antenna impedance, delivered power corresponding to an antenna tuner state, or a combination thereof, at a display.

20. The apparatus of claim 1, wherein the switched load comprises:
a first load having a first terminal coupled to ground and a second terminal selectively coupled to a main switch of the switched load;
a second load having a first terminal coupled to ground and a second terminal selectively coupled to the main switch; and
a third load having a first terminal coupled to ground and a second terminal selectively coupled to the main switch.

* * * * *